US008059423B2

(12) United States Patent  
Biunno (10) Patent No.: US 8,059,423 B2
(45) Date of Patent: Nov. 15, 2011

(54) ENHANCED LOCALIZED DISTRIBUTIVE CAPACITANCE FOR CIRCUIT BOARDS

(75) Inventor: Nicholas Biunno, Santa Clara, CA (US)

(73) Assignee: Sanmina-Sci Corporation, San Jose, CA (US)

( * ) Notice: Subject to any disclaimer, the term of this patent is extended or adjusted under 35 U.S.C. 154(b) by 0 days.

(21) Appl. No.: 11/672,035

(22) Filed: Feb. 6, 2007

(65) Prior Publication Data

US 2008/0273311 A1 Nov. 6, 2008

(51) Int. Cl.
*H05K 1/18* (2006.01)
(52) U.S. Cl. ........ 361/763; 361/272; 361/303; 361/313; 361/782; 174/260; 174/262; 438/250; 257/532; 257/780
(58) Field of Classification Search .................. 361/763, 361/303, 313, 782, 272; 174/262, 260; 438/250; 257/532, 780
See application file for complete search history.

(56) References Cited

U.S. PATENT DOCUMENTS

| | | | |
|---|---|---|---|
| 6,037,677 A * | 3/2000 | Gottschall et al. ............. 307/43 |
| 6,215,373 B1 | 4/2001 | Novak |
| 6,388,207 B1 * | 5/2002 | Figueroa et al. ............. 174/262 |
| 6,441,313 B1 | 8/2002 | Novak |
| 6,716,072 B1 * | 4/2004 | Downes ........................ 439/876 |
| 6,900,991 B2 * | 5/2005 | Patel et al. .................... 361/782 |
| 7,092,237 B2 * | 8/2006 | Lee et al. ...................... 361/311 |
| 7,190,592 B2 * | 3/2007 | Hu ................................. 361/763 |
| 7,281,321 B2 * | 10/2007 | Kim et al. ........................ 29/832 |
| 7,293,356 B2 * | 11/2007 | Sohn et al. ....................... 29/852 |
| 7,326,858 B2 * | 2/2008 | Lee et al. ........................ 174/260 |
| 7,339,798 B2 * | 3/2008 | Chakravorty ................. 361/782 |
| 7,388,158 B2 * | 6/2008 | Yoon et al. ..................... 174/262 |
| 7,791,210 B2 * | 9/2010 | Miller et al. ................... 257/780 |
| 2004/0099999 A1 * | 5/2004 | Borland ........................ 264/618 |
| 2005/0195554 A1 * | 9/2005 | Borland et al. ............... 361/303 |
| 2006/0138591 A1 * | 6/2006 | Amey et al. ................... 257/532 |
| 2006/0215380 A1 * | 9/2006 | Lu et al. ........................ 361/763 |
| 2007/0085212 A1 * | 4/2007 | Mao et al. ..................... 257/758 |
| 2007/0236859 A1 * | 10/2007 | Borland et al. ............... 361/272 |
| 2007/0275525 A1 * | 11/2007 | Das et al. ....................... 438/250 |

OTHER PUBLICATIONS

I. Novak, Reducing Simultaneous Switching Noise and EMI on Ground/Power Planes by Dissipative Edge Termination, pp. 274-283, Aug. 1999, IEEE Trans. Adv. Packag., vol. 22, No. 3., United States.

* cited by examiner

*Primary Examiner* — Xiaoliang Chen
(74) *Attorney, Agent, or Firm* — Julio M. Loza; Loza & Loza, LLP (57) ABSTRACT

A multi-layered circuit board is provided having a buried capacitive layer and a device-specific embedded, localized, non-discrete, and distributive capacitive element. A printed circuit board is provided including (1) a first dielectric layer, (2) a first conductive layer coupled to a first surface of the first dielectric layer, (3) a second conductive layer coupled to a second surface of the first dielectric layer, and (4) a localized distributive non-discrete capacitive element adjacent the first conductive layer, wherein the capacitive element occupies a region that approximately coincides with a location over which a device to be coupled to the capacitive element is to be mounted. The embedded, localized, non-discrete, and distributive capacitive element may provide device-specific capacitance to suppress voltage/current noise for a particular device.

18 Claims, 9 Drawing Sheets

ENHANCED LOCALIZED DISTRIBUTIVE CAPACITANCE FOR CIRCUIT BOARDS

FIELD

Various embodiments of the invention pertain to circuit boards. At least one embodiment of the invention pertains to an enhanced embedded capacitance in a circuit board that is non-discrete, localized, and distributive.

BACKGROUND

Figure 1:
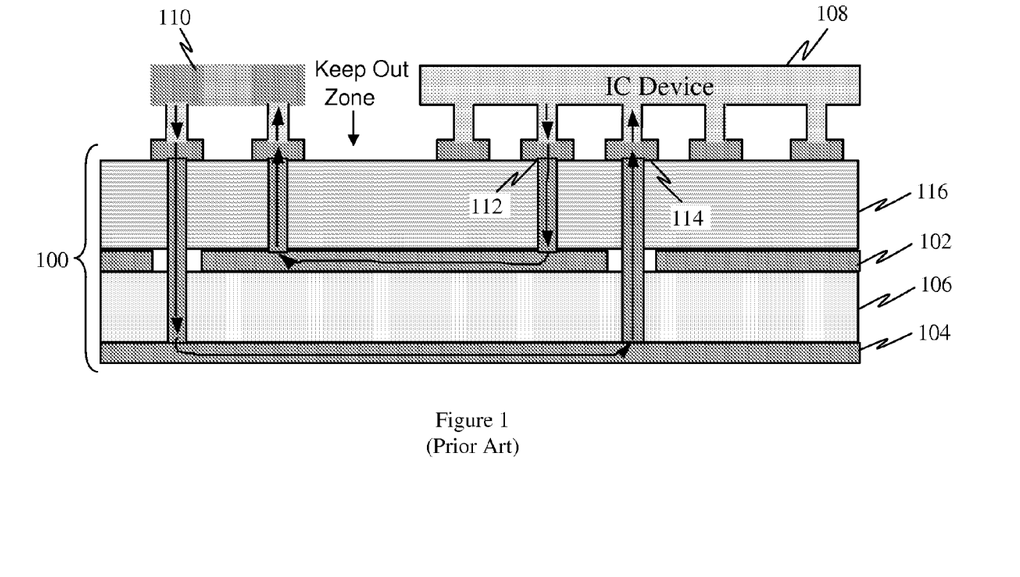
FIG. 1 illustrates a cross-sectional view of a prior art integrated capacitive laminate structure that uses a surface mounted bypass capacitor to suppress current/voltage noise for an integrated circuit device.

In the art of circuit design and circuit board manufacturing, capacitors are commonly employed in order to reduce electromagnetic interference, decouple signals, reduce or dampen resonances, suppress current/voltage noise, improve signal quality, filter signals, and several further such purposes and/or functions. A distributed interplane capacitance (or buried capacitance) is typically formed between a power and ground plane to provide global power distribution network impedance improvements to the whole printed circuit board. In addition to distributed interplane capacitance, bypass capacitors are often used with specific devices. Typically, small-valued capacitors located near the power pins of an active device are employed for high-frequency decoupling (e.g., resonance dampening, noise suppression, etc.). For example, FIG. 1 illustrates a cross-sectional view of a prior art integrated capacitive laminate structure that uses a surface mounted bypass capacitor 110 to suppress current/voltage noise for an integrated circuit device 108. A printed circuit board 100 may include multiple layers 116 along with a first conductive layer 102, a second conductive layer 104, and a dielectric layer 106 sandwiched between the first conductive layer 102 and the second conductive layer 104 to create an integrated capacitive laminate. The IC device 108 is mounted to the printed circuit board 100. In order to supply additional capacitance to the IC device 108, above and beyond the capacitance provided by the integrated capacitive laminate, a discrete, surface mounted capacitor 110 is also mounted to the printed circuit board 100. To reach the surface mounted capacitor 110, an electrical path is formed from a first terminal 112 at the IC device 108, through the first conductive layer 102, to the discrete surface mounted capacitor 110, then to the second conductive layer 104, and to a second terminal 114 at the IC device 108.

Figure 2:
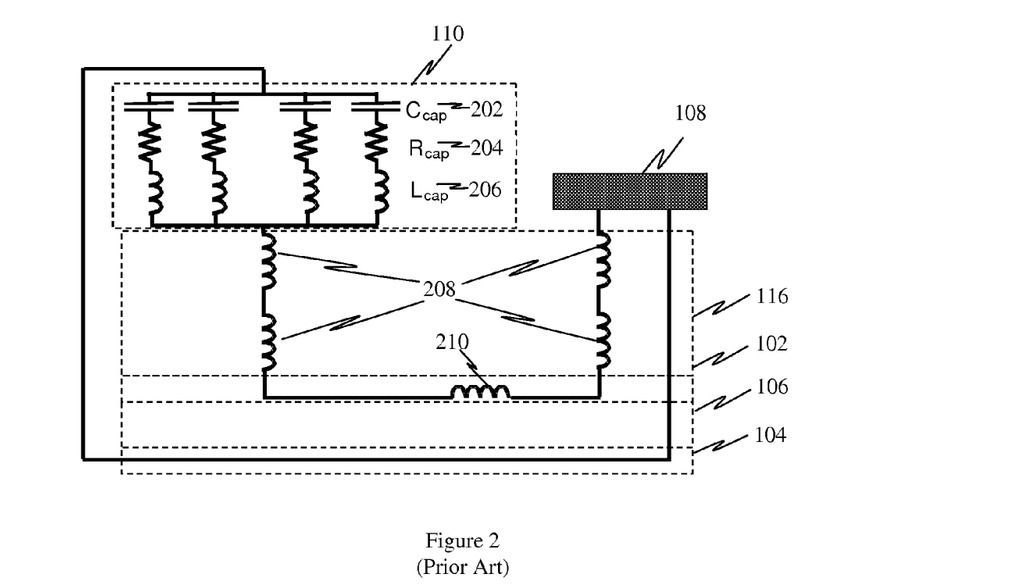
FIG. 2 is a schematic circuit diagram of the prior art integrated capacitive laminate circuit of FIG. 1.

When circuit board designers do not face space constraints on the surface of a circuit board, discrete capacitors are commonly mounted to the surface of the circuit board. However, with the increased complexity of circuits and the reduction in the size of electronic devices, the space on the surface of a circuit board is often limited and does not allow room to surface mount numerous capacitors. For instance, due to manufacturing constraints, a keep out zone is maintained around the IC device 108 where no surface mounted capacitors (or any other device) can be mounted. Adding surface mounted capacitors is further undesirable because, with the addition of each capacitor, vias and/or electrical paths have to be added that result in undesirable qualities, such as additional inductance and resistance. For example, FIG. 2 is a schematic circuit diagram of the prior art integrated capacitive laminate circuit of FIG. 1. The combined electrical effects of the discrete surface mounted capacitor 110 are illustrated by an equivalence circuit showing the capacitance 202, resistance 204, and inductance 206 associated with discrete capacitor 110. Additionally, the vias and electrical paths through the circuit board also contribute additional inductance 208 and 210. These additional capacitive, resistive, and inductive elements are undesirable because they, reduce bypass bandwidth, create resonances, noise, interference, and otherwise corrupt electrical signals.

Thus, integrated capacitive laminates have been developed, wherein a thin dielectric layer between two conductor foils provides distributive capacitance to the circuit and replaces one or more conventional discrete capacitors. U.S. Pat. No. 5,079,069 to Howard et al., for example, discloses a capacitive printed circuit board (PCB) that provides capacitance to a large number of devices by a sheet of dielectric material that is sandwiched between two sheets of conductive material. Howard, thus, discloses a PCB that provides capacitance to each individual device by a portion of the capacitor laminate proportional to the individual device and borrowed capacitance from other portions of the capacitor laminate, depending upon the random firing of the devices. The PCB disclosed by Howard et al., thus, allows many of the benefits of conventional, surface mounted capacitors, while preserving space on the surface of the circuit board because the capacitance is integrated to the layers of the PCB itself.

While PCBs using integrated capacitive laminates are disclosed by Howard et al., these are generally successful in providing capacitance to a number of devices. In certain applications the capacitance supplied by such integrated capacitive laminates is insufficient. For example, because of their potential for interference and noise, certain high power, high switching speed integrated circuit (IC) devices require capacitance that exceeds that which can be supplied by integrated capacitive laminates. Circuit designers, thus, are required to employ additional localized, surface mounted capacitors in order to provide sufficient capacitance for the IC device. Such localized, surface mounted capacitors, however, are undesirable for the reasons discussed above.

Others have sought to improve upon the integrated capacitive laminates. For example, U.S. Pat. No. 6,215,373 by Novak et al., discloses a system and method for stabilizing the impedance of a circuit board by adding an embedded electrical resistance about the periphery of the circuit board. While disclosing a system and method for stabilizing a circuit board's impedance, the '373 patent fails to disclose a system for providing localized capacitance to a specific device on a circuit board.

Another such system is disclosed by U.S. Pat. No. 6,441,313 by Novak. The '313 patent discloses an apparatus for reducing power plane resonances in an integrated capacitive laminate structure. The apparatus reduces power plane resonances by employing a lossy power distribution network that is formed by a pair of parallel planar conductors separated by a dielectric layer. The '313 patent, however, also fails to disclose a system for providing localized capacitance to a specific device on a circuit board.

Thus, there remains a long felt need in the art for a providing device-specific capacitance on a circuit board without utilizing surface space or increasing overall inductance.

SUMMARY

Various embodiments of the invention are directed towards a localized, non-discrete, and distributive capacitive element for providing device-specific capacitance to one or more devices on a circuit board.

A printed circuit board is provided comprising: (a) a first dielectric layer having a first surface and an opposite second surface, (b) a first conductive layer coupled to the first surface of the first dielectric layer, (c) a second conductive layer coupled to the second surface of the first dielectric layer; and/or (d) a localized distributive non-discrete capacitive element adjacent the first conductive layer. The localized distributive non-discrete capacitive element may occupy a perimeter region that approximately coincides with a perimeter for a device to be decoupled by the capacitive element. One or more circuit board layers may be positioned over the localized distributive non-discrete capacitive element to embed the localized distributive non-discrete capacitive element within the circuit board. The first conductive layer and the second conductive layer may define a buried capacitance of the printed circuit board and the localized non-discrete capacitive element provides a distinct bypass capacitance to the device to which it is coupled. The first conductive layer may be one of either a power plane or a ground plane.

The localized distributive non-discrete capacitive element may include: (a) a first conductive element defined by an area of the first conductive layer, (b) a second conductive element defined by an isolation gap on the first conductive layer, the second conductive element separate but adjacent to the first conductive element and electrically isolated from the first conductive layer, (c) a dielectric element positioned over the first conductive element, (d) a third conductive element positioned over the dielectric element, extending across the isolation gap, and coupled to the second conductive element, and/or (e) one or more electrically conductive vias coupling the second conductive element and the second conductive layer. A first electrical via may extend from a first surface terminal to the first conductive element, and a second electrical via may extend from a second surface terminal to the second conductive layer. The first conductive element may be defined as a perimeter band around a ball grid array anti-pad pattern for the device to be decoupled. The third conductive element may include a resistive material selected to achieve a desired equivalent series resistance. The region occupied by the capacitive element approximately coincides with a perimeter region of the device to be coupled to the capacitive element.

A localized distributive non-discrete capacitive element embedded in a circuit board is also provided, comprising: (a) a first conductive element defined by an area of a first conductive layer of the circuit board, (b) a second conductive element defined by an isolation gap on the first conductive layer, the second conductive element separate but adjacent to the first conductive element and electrically isolated from the first conductive layer, (c) a dielectric element positioned over the first conductive element and extending to a region between the first conductive element and the second conductive element, and/or (d) a third conductive element positioned over the dielectric element, extending across the isolation gap, and coupled to second conductive element to form a bypass capacitor between the first conductive element and the second conductive element. One or more circuit board layers may be positioned over the localized distributive non-discrete capacitive element to embed the capacitive element within the circuit board. In one example, the capacitive element may occupy a region that approximately coincides with a location over which a device to be coupled to the capacitive element is to be mounted. In another example, the capacitive element may occupy a region that approximately coincides with a perimeter region of a device to be coupled to the capacitive element. In yet another example, the capacitive element may occupy a region below a keep out zone on the surface of the circuit board proximate a device to be coupled to the capacitive element.

A method is also provided for manufacturing a printed circuit board with an embedded localized non-discrete capacitive element. A first dielectric layer is provided having a first surface and an opposite second surface. A first conductive layer is provided on the first surface of the first dielectric layer. A second conductive layer is provided on the second surface of the first dielectric layer. The localized non-discrete capacitive element is formed on the first conductive layer, wherein the capacitive element occupies a region that approximately coincides with a location over which a device to be coupled to the capacitive element is to be mounted.

In one example, forming the localized distributive non-discrete capacitive element on the first conductive layer includes: (a) defining a first conductive element on the first conductive layer, (b) forming a second conductive element defined by an isolation gap on the first conductive layer, the second conductive element separate but adjacent to the first conductive element and electrically isolated from the first conductive layer, (c) forming a dielectric element over the first conductive element, (d) forming a third conductive element over the dielectric element, extending across the isolation gap and coupled to second conductive element, and/or (e) forming one or more electrically conductive vias coupling the second conductive element and the second conductive layer. The third conductive element may include a resistive material selected to achieve a desired equivalent series resistance and the localized non-discrete capacitive element provides a distinct bypass capacitance to the device to which it is coupled.

A first electrical via may be formed extending from a first surface terminal to the first conductive element. Similarly, a second electrical via may be formed extending from a second surface terminal to the second conductive layer. One or more circuit board layers may be provided over the localized distributive non-discrete capacitive element to embed the localized distributive non-discrete capacitive element within the circuit board. The device may be mounted on the printed circuit board and the device is then coupled to the localized distributive non-discrete capacitive element.

DETAILED DESCRIPTION

In the following description numerous specific details are set forth in order to provide a thorough understanding of the invention. However, one skilled in the art would recognize that the invention might be practiced without these specific details. In other instances, well known methods, procedures, and/or components have not been described in detail so as not to unnecessarily obscure aspects of the invention.

In the following description, certain terminology is used to describe certain features of one or more embodiments of the invention. For instance, "circuit board" refers to surfaces that mechanically support and electrically connect electronic components using conductive pathways, including multi-layered circuit boards. The term "localized" refers to the quality of providing capacitance to one or more devices within a specific/limited area or region on a circuit board. The term "non-discrete" refers to the quality of providing capacitance to a circuit without the use of a discrete or surface mounted device (such as a discrete capacitor). The term "distributive" refers to property of distributing capacitance over an area or region. The term "embedded" refers to a location below the surface of a printed circuit board.

A multi-layered circuit board is provided having a buried capacitive layer and a device-specific embedded, localized, non-discrete, and distributive capacitive element. In one example, this capacitive element may provide enhanced capacitance to suppress voltage/current noise for a particular integrated circuit.

Figure 3:
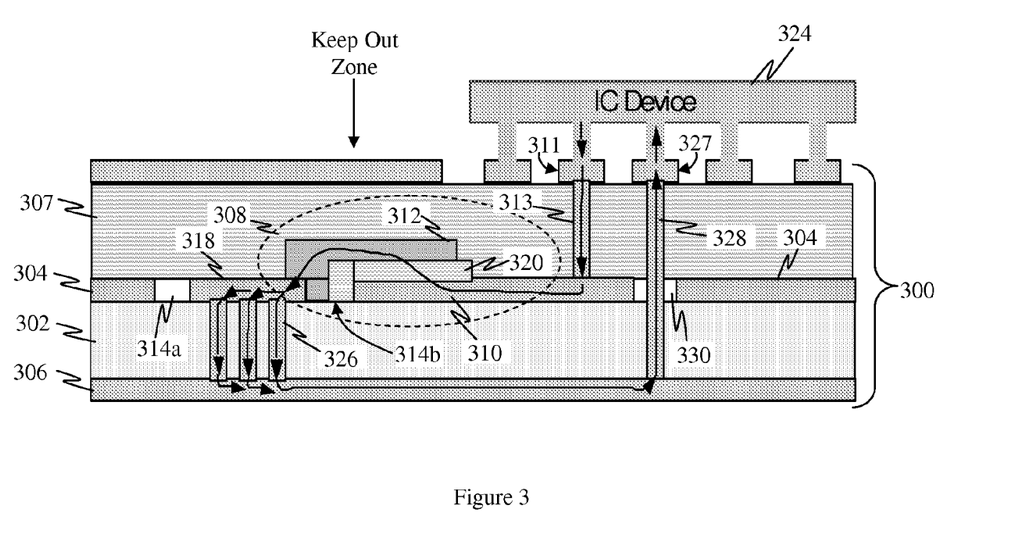
FIG. 3 illustrates a cross-sectional view of an integrated capacitive laminate having a supplemental enhanced localized distributive capacitance.

FIG. 3 illustrates a cross-sectional view of an integrated capacitive laminate having a supplemental enhanced localized distributive capacitance. A printed circuit board 300 that includes an enhanced localized distributive non-discrete capacitive element 308 and an embedded capacitive layer. The buried capacitive layer is formed by a first dielectric layer 302 buried between a first conductive layer 304 and a second conductive layer 306. These layers 304 and/or 306 may be foils, sheets, deposited materials, etc. The first dielectric layer 302, first conductive layer 304 and second conductive layer 306 may be laminated together or layered by deposition or any other known methods. In one embodiment the first conductive layer 304 may serve as a ground layer and the second conductive layer 306 may serve as a power layer (or vice-versa) for the circuit board 300. Additionally, other conductive and/or non-conductive or dielectric layers 307 may be added on either side of the enhanced localized distributive non-discrete capacitive element 308.

The enhanced localized distributive non-discrete capacitive element 308 is formed by a dielectric filler element 320 sandwiched between a first conductive element 310 and a third conductive element 312. In one example, the third conductive element 312 may be a resistive conductive element and/or include one or more materials that operate as a controlled resistance. The first conductive element 310 is a region (e.g., a band) of the first conductive layer 304 and is electrically coupled to a first terminal 311 of the integrated circuit device 324 by a via 313. The third conductive element 312 is electrically coupled to a second conductive element 318 which is formed from an isolated portion of the first conductive layer 304. The third conductive element 312 may be made from a material with different composition than the second conductive element 318. An isolation gap 314a and 314b is formed around the second conductive element 318. The first dielectric element 320 extends into the isolation gap 314b to electrically isolate the third conductive element 312 from the first conductive element 310. The third conductive element 312 is electrically coupled to the second conductive element 318 and extends over the electrical isolation gap 314b and a portion of the first conductive element 310. The second conductive element 318 is electrically coupled to the second conductive layer 306 through one or more vias 326. The second conductive layer 306 is coupled to a second terminal 327 for the integrated circuit 324 by a conductive via 328 that passes through an anti-pad 330 (e.g., hole) in the first conductive layer 304. In this manner, resonances and/or current/voltage noise between the first terminal 311 and second terminal 327 may be reduced, dampened, suppressed, and/or filtered by the enhanced localized distributive non-discrete capacitive element 308. That is, high frequency signals (e.g., resonances, noise, spikes, etc.) pass across the enhanced distributive non-discrete capacitive element 308 (between the first conductive element 310 and second conductive layer 306) without the need for a discrete surface mounted capacitor and without occupying additional circuit board surface space.

Figure 4:
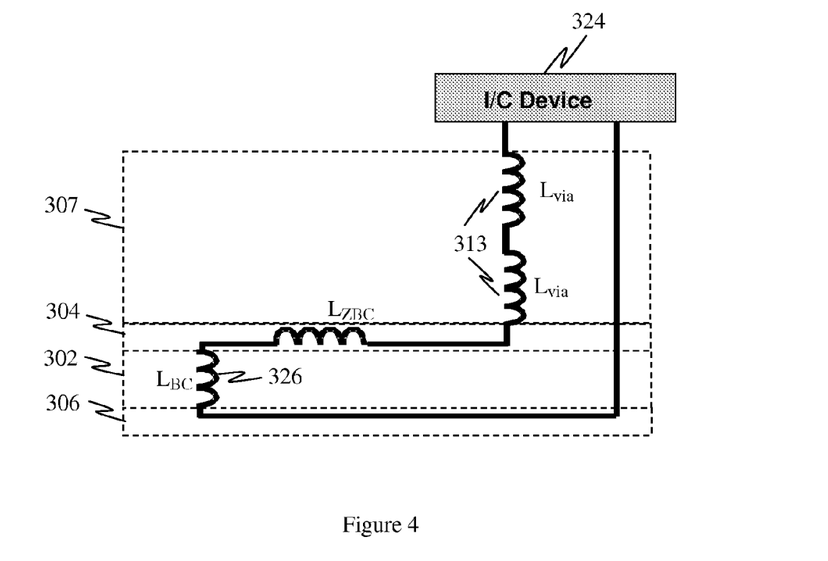
FIG. 4 is a circuit diagram of the embedded localized distributive non-discrete capacitive element of FIG. 3.

FIG. 4 is an inductive loop circuit diagram of the embedded localized distributive non-discrete capacitive element of FIG. 3. The combined electrical effects of the embedded localized distributive non-discrete capacitive element layout are illustrated by an equivalence circuit showing inductances $L_{via}$ associated with one or more vias 313 crossing one or more conductive and/or non-conductive or dielectric layers 307, an inductance $L_{ZBC}$ associated with an electrical path through the conductive layers 304 and 306, and an inductance $L_{BC}$ associated with a via across the first dielectric layer 302 (between conductive layers 304 and 306). By comparison with surface mounted bypass capacitors (as illustrated in FIG. 2), the present invention may reduce the overall circuit loop inductance thereby increasing the high frequency cutoff. Extending the high frequency cutoff effectively increases the range of high frequency bypassing. In particular, the extra inductance associated with adding a via to a surface mounted discrete capacitor and the inductance associated with such discrete capacitor 110 are eliminated or reduced.

The enhanced localized distributive non-discrete capacitive element 308 may be embedded in the circuit board 300, thus saving surface space on the circuit board 300. As a result, the capacitive element 308 does not interfere with the surface mounted manufacturing process and may be partially or completely within a keep out zone. That is, the capacitive element 308 may be located below a keep out zone on which surface mounted devices should not be located on the surface of the circuit board 300.

Figure 5:
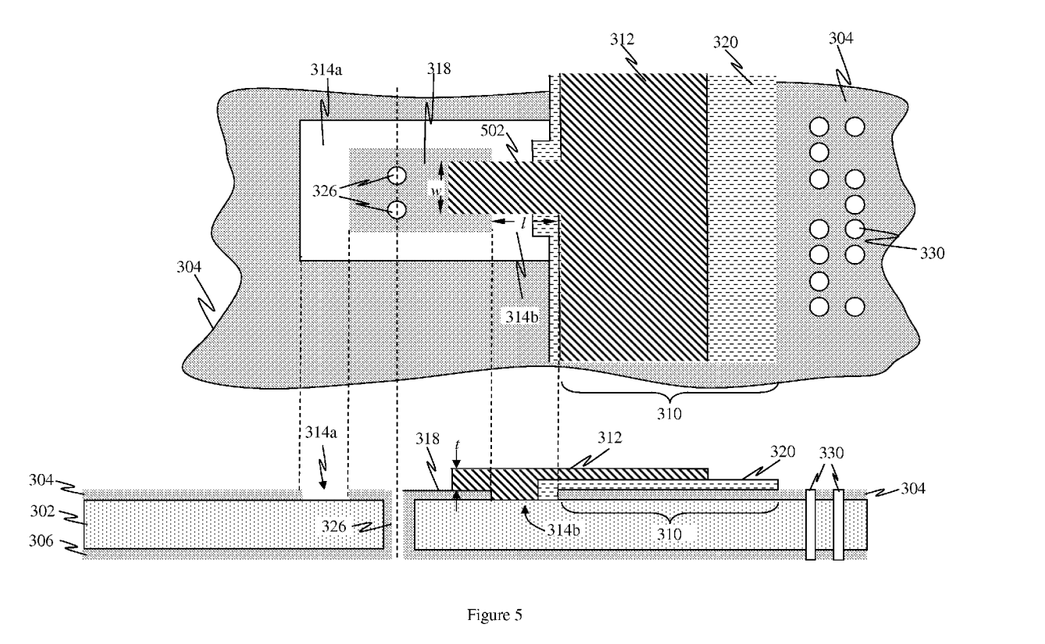
FIG. 5 illustrates an exploded cross-sectional and top view of the embedded localized distributive non-discrete capacitive element of FIG. 3.

FIG. 5 illustrates an exploded cross-sectional and top view of the embedded localized distributive non-discrete capacitive element of FIG. 3. To form the localized distributive non-discrete capacitive element, the first conductive element 310 is defined as a perimeter band around an IC device anti-pad pattern 330. The anti-pad pattern 330 is formed in the first conductive layer 304 (e.g., by etching or other known manufacturing methods). Similarly, the second conductive element 318 is formed from a portion of the first conductive layer 304 by creating an isolation gap 314 (e.g., by etching or other known manufacturing methods) that electrically isolates the second conductive element 318 from the first conductive layer 304. The first dielectric element 320 is then deposited or layered over the first conductive element 310 or portion thereof (e.g., a perimeter region or band on first conductive layer 304). The first dielectric element 320 may extend into the gap 314 (around a perimeter portion of the first conductive element 310) to help electrically isolate the first conductive element 310 from the second conductive element 318. The third conductive element 312 is then deposited or layered over the first dielectric element 320 (or portion thereof), across gap 314, and over the second conductive element 318 (or portion thereof). As illustrated in the top view of the embedded localized distributive non-discrete capacitive element, an electrical route portion 502 extends over the gap 314 to electrically connect the third conductive element 312 to the second conductive element 318. One or more conductive vias 326 electrically couple the second conductive element 318 to the second conductive layer 306. Thus, an embedded localized distributive non-discrete capacitive element is formed by the first conductive element, first dielectric element 320 and third conductive element 312 through which high frequencies can pass to the second conductive layer 306.

The localized high capacitance region created by the capacitive element 308 may provide an adjustable and/or controllable equivalent series resistance to provide circuit resonance dampening and/or current/voltage noise suppression. For instance, the third conductive element 312 may include a resistive material selected to provide a desired resonance dampening. Resistance may be controlled and/or adjusted by controlling the sheet resistance ($R_S$), in ohms/sq., of the third conductive element 312. In one example, the third conductive element 312 may be fabricated using a twenty-five (25) ohm/sq. resistive screen printed paste TU-25-M from ASAHI Research Chemical, LLC. The resistance may be further controlled by adjusting the length (l) and width (w) of an electrical route portion 502 (illustrated in FIG. 5). For example, the length (l) of the electrical route 502 may be 0.015" and the width (w) may be 0.090". For a screen printed thickness (t) of the conductive element 312 and the route portion 502 of 0.72 mils and (N) number of route portions 512 the resistance R of the resistive element is determined as:

$$R = \frac{R_S}{t}\left(\frac{l}{w}\right)\frac{1}{N} = \frac{25}{0.72}\left(\frac{0.015}{0.090}\right)\frac{1}{8} = 0.72 \text{ ohms}.$$

Figure 6:
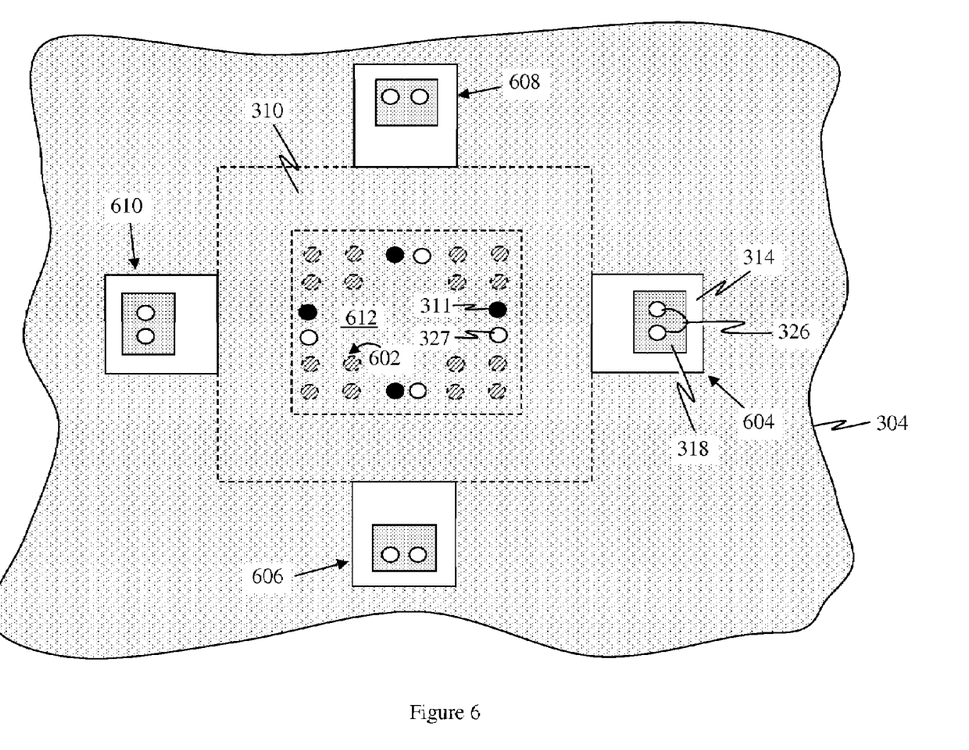
FIGS. 6, 7, and 8 illustrate top views of the construction of an embedded localized distributive non-discrete capacitive element according to one implementation.
Figure 7:
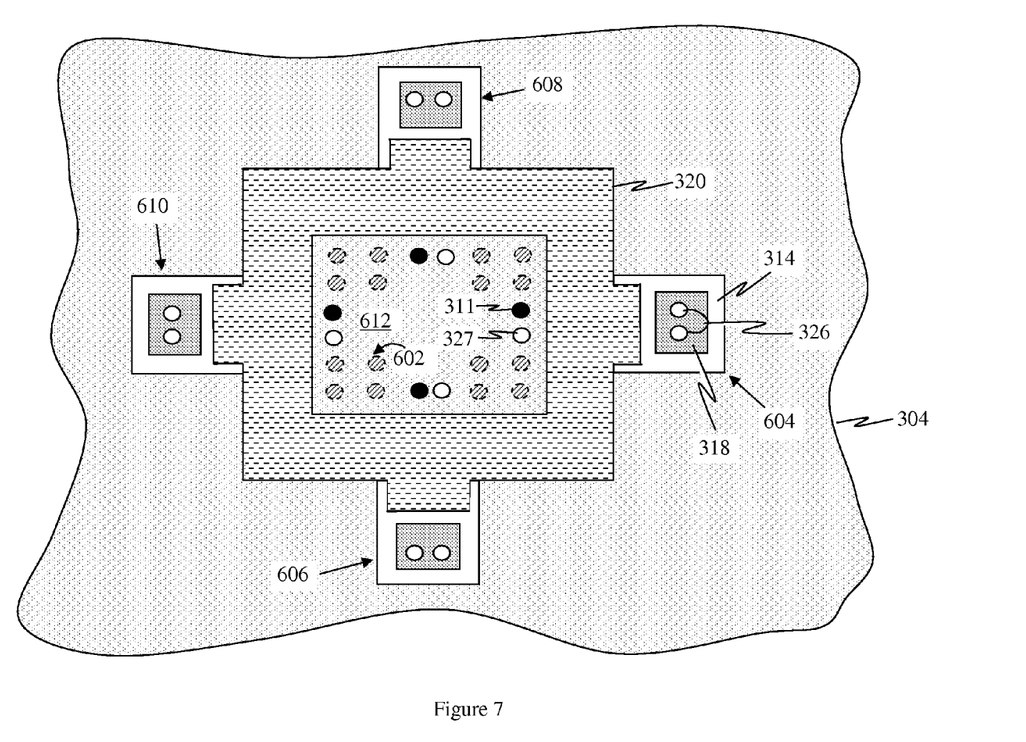
Figure 8:
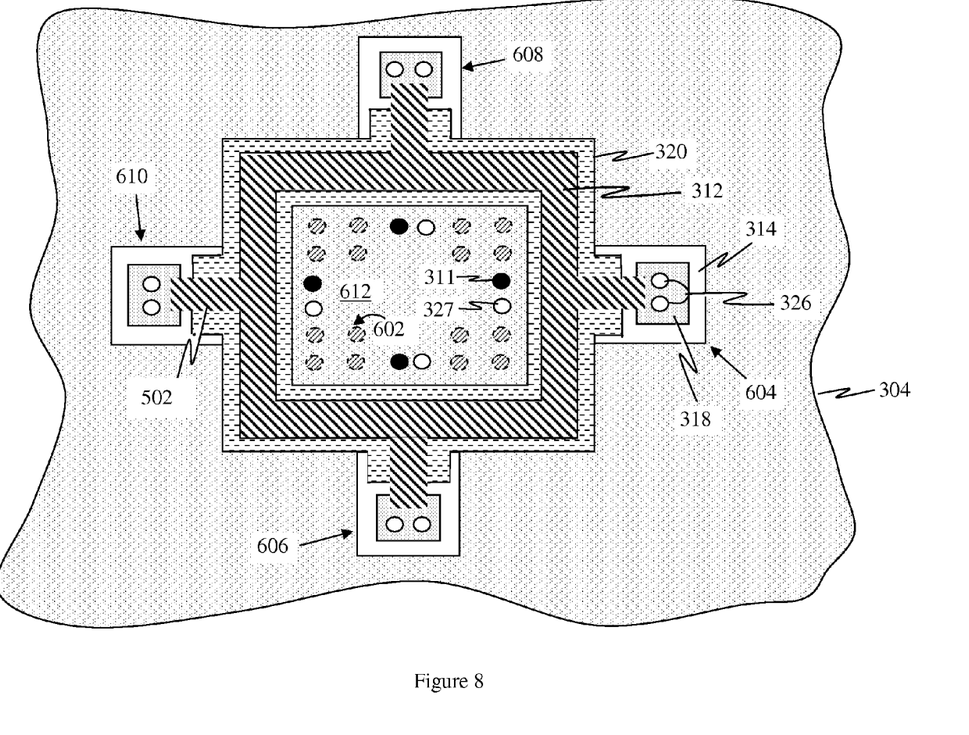

FIGS. 6, 7 and 8 illustrate a top view of the construction of an embedded localized distributive non-discrete capacitive element according to one implementation. In this example, a ball grid array 602 is located over central region 612 surrounded by the first conductive element (region) 310. The central region 612 (e.g., interior open area) and the first conductive element 310 are defined for purposes of explanation but they are integral regions of the first conductive layer 304. As previously described, the localized distributive non-discrete capacitive element is formed by the first conductive element 310 (FIG. 6), the dielectric element 320 (FIG. 7), and the third conductive element 312 (FIG. 8). The embedded localized distributive non-discrete capacitive element 308 may be defined or shaped as a perimeter band that surrounds and approximately coincides with an outer perimeter for a device 324 to be decoupled by the localized distributive non-discrete capacitive element 308, the perimeter band defining central region 612 (an interior open area) below the device 324. In this example, the localized distributive non-discrete capacitive element (308 in FIG. 5) is coupled to the second conductive layer (306 in FIG. 5) at four locations 604, 606, 608, and 610 around the perimeter of a device that may be mounted on the ball grid array 602. The localized distributive non-discrete capacitive element may occupy a region (e.g., area, size, orientation and/or location) that approximately coincides with a perimeter region around a location over which a device (to be coupled to the embedded localized distributive non-discrete capacitive element) is to be mounted. Some of the interfaces of the ball grid array 602 may serve as the first terminal 311 to the first conductive layer 304 and the second terminal 327 to the second conductive layer 306. Thus, device-specific capacitance may be supplied to a device, such as a high-frequency integrated circuit (IC) device, by surrounding the IC device with a localized distributive non-discrete capacitive element. In alternative embodiments, a device may be coupled to a localized distributive non-discrete capacitive element at a plurality of other locations (e.g., fewer or greater than the four locations illustrated in FIG. 6).

Figure 9:
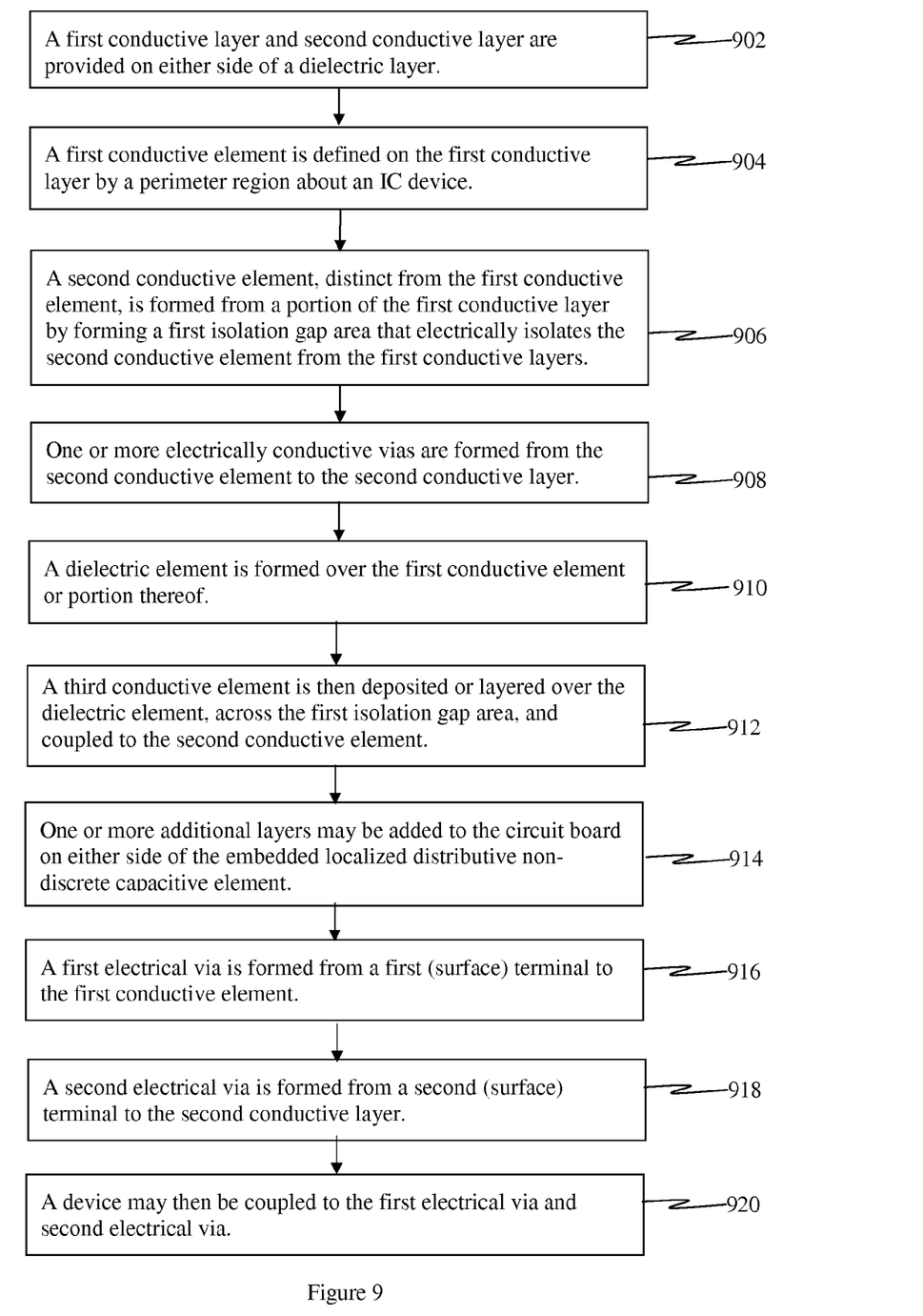
FIG. 9 illustrates a method for manufacturing a circuit board having an embedded localized distributive non-discrete capacitive element.

FIG. 9 illustrates a method for manufacturing a circuit board having an embedded localized distributive non-discrete capacitive element. A first conductive layer and second conductive layer are provided (e.g., by material deposition, lamination, etc.) on either side of a dielectric layer 902. A first conductive element is defined on the first conductive layer by a perimeter region about an IC device 904. The area, size, orientation and/or location of the first conductive element may approximately coincide with a region over which the IC device (to be coupled to the embedded localized distributive non-discrete capacitive element) is to be mounted on the circuit board. A second conductive element, distinct from the first conductive element, is formed from a portion of the first conductive layer by forming a first isolation gap area (e.g., by etching or other known manufacturing methods) that electrically isolates the second conductive element from the first conductive layer 906. The above steps may be preformed at the same time (e.g., by etching or other known manufacturing methods). One or more electrically conductive vias are formed from the second conductive element to the second conductive layer 908. A dielectric element is formed (e.g., deposited or layered) over the first conductive element or portion thereof 910 (e.g., a perimeter region of the first conductive element). For instance, the dielectric element may extend into a portion of the first isolation gap area around the second conductive element. A third conductive element is then deposited or layered over the dielectric element (or portion thereof), across the first isolation gap area, and coupled to the second conductive element (or portion thereof) 912. The third conductive element may include a resistive material selected to achieve a desired equivalent series resistance (ESR) for a particular implementation.

One or more additional layers may be added to the circuit board on either side of the localized distributive non-discrete capacitive element 914. The one or more additional layers may embed the localized distributive non-discrete capacitive element there between. A first electrical via is formed from a first (surface) terminal to the first conductive element 916. Similarly, a second electrical via is formed from a second (surface) terminal to the second conductive layer 918. The first and second terminals allow a device to couple to the embedded localized distributive non-discrete capacitive element 920. Thus, an embedded localized distributive non-discrete capacitive element is formed by the first conductive element, first dielectric element and third conductive element through which high frequencies can pass to the second conductive layer.

According to one example of a method for manufacturing a localized distributive capacitance, a dielectric paste CX-16 with a dielectric constant of fifty (50) from ASAHI Research Chemical, LLC may be screen printed and cured to form a dielectric layer 320 (FIGS. 3 and 5) on the first conductive element 310 around a perimeter of the central region 612 (FIGS. 3, 5, 6, 7, and 8). A third conductive element 312 (top capacitor electrode) (FIGS. 3, 5 and 8) may be applied in a second screen print and cure operation using a resistive paste TU-25-M from ASAHI Research Chemical, LLC having a sheet resistance of twenty-five (25) ohms/sq. In one example design, four (4) electrical route portions 502 (FIG. 5) are approximately equally spaced around the localized distributive capacitive element (as illustrated in FIG. 8). In other implementations, a plurality of electrical route portions 502 may be employed. For instance two (2), six (6), eight (8), etc., electrical route portions 502 may be placed around the perimeter of the BGA pattern. In one example, the length and width of each of the electrical route portions 502 may be adjusted to give the localized distributive capacitor element an ESR value of 0.72 ohms. By varying the length, width, and/or number of electrical route portions 502 and/or varying the sheet resistance of third conductive element 312, other resistance values may be obtained. In one example, each of the electrically isolated second conductive elements 318 may have three (3) conductive vias 326 that electrically couple the second conductive elements 318 to the second conductive layer 306. In one example, the multitude of vias 326 reduces the inductance $L_{BC}$ by a factor of twenty-four (24) which effectively increases the de-coupling range and anti-resonance mode dampening of the localized non-discrete capacitive element to higher frequencies.

Figure 10:
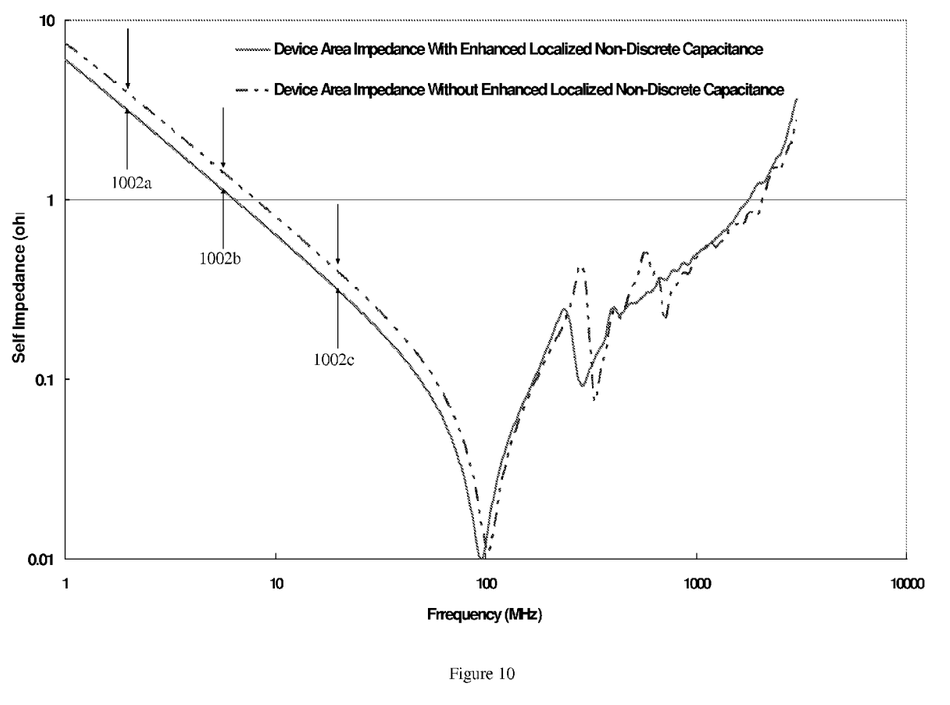
FIG. 10 illustrates a comparison of broad band self impedance of a circuit board with and without localized distributive non-discrete capacitive element.
Figure 11:
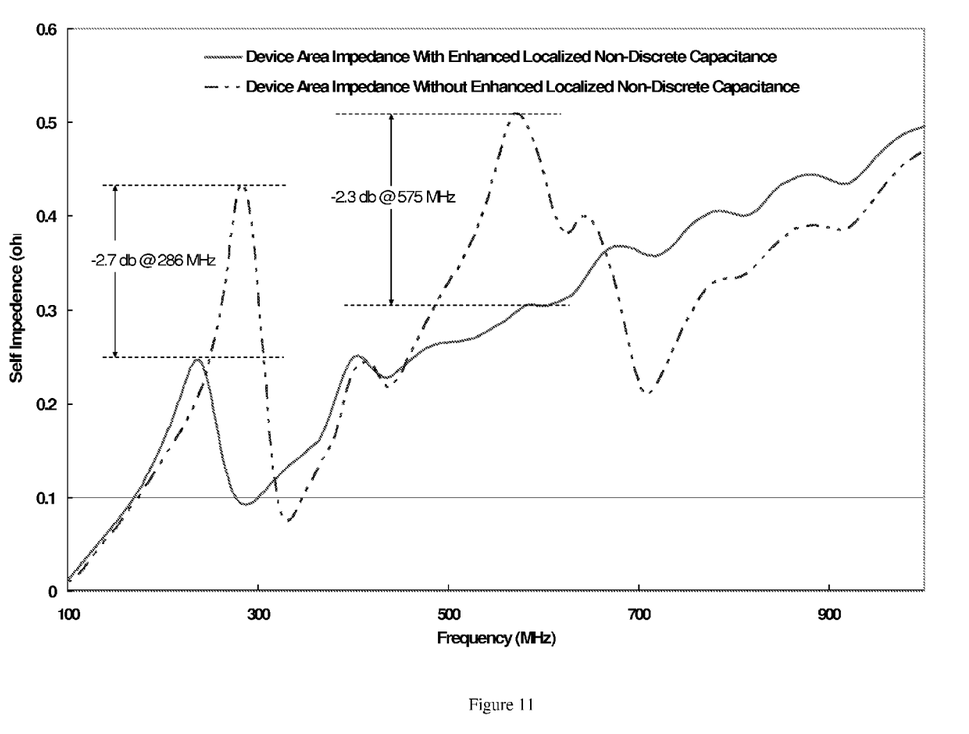
FIG. 11 illustrates a comparison anti-resonance mode dampening of a circuit board with and without localized distributive non-discrete capacitive element.

FIGS. 10 and 11 illustrate the electrical characteristics of multilayer circuit boards with an enhanced localized non-discrete capacitive element in comparison to a similar conventional multilayer circuit board that would accept surface mounted capacitor. The enhanced localized non-discrete capacitive element may be formed and/or configured as described in the previous example, with eight (8) electrical route portions 502, an ESR value of 0.72 ohms, and three (3) conductive vias 326 per isolated second conductive elements 318. FIG. 10 illustrates a broadband self-impedance spectrum of a BGA area with and without the localized distributive non-discrete capacitive element 308. The lower frequency region from 1 to 100 MHz shows a region 1002 of decreased self-impedance (which corresponds to an increase in capacitance of 4.2 nF) that is consistence with the dielectric thickness of the dielectric layer 320 (FIG. 5) and perimeter length and width of the top capacitor electrode or third conductive element 312. Higher values of capacitance may be achieve using other manufacturing methods (e.g., thinner dielectric layers) and materials (having higher dielectric constants) that are within the scope of the present invention.

FIG. 11 illustrates an expanded view of the higher frequency portion of the self impedance spectrum and the detailed anti-resonance modes that are typically present between conductive plane layers 304 and 306. The addition of the localized non-discrete capacitive element (i.e., an equivalent series resistance) in any circuit path for conductive plane layers 304 and 306 has the effect of dampening higher order anti-resonance modes. As described above, adjusting the ESR value of the enhanced localized capacitive element by material selection and/or geometry achieves an anti-resonance dampening effect. For instance, in FIG. 11, the anti-resonance mode at 286 Mhz has been reduced by −2.7 db and the mode at 575 Mhz was reduced by −2.3 db.

It should be noted that the position of the localized distributive non-discrete capacitive element relative to the first conductive layer may be varied depending on the specifications for the circuit board. A plurality of localized distributive non-discrete capacitive elements may be place on the first conductive element to coincide with multiple IC devices that may be mounted on a circuit board to provide each device its own localized distributive capacitance. The localized distributive non-discrete capacitive element may be embedded in the first conductive layer, located adjacent to the first conductive layer, and/or embedded in the first dielectric layer. These and other locations for the localized distributive non-discrete capacitive element remain within the contemplation of the invention.

Various aspects of the invention may be adapted to various configurations of circuit boards. In various embodiments of the invention, for example, the localized distributive non-discrete capacitive element functions as a bypass capacitor for an integrated circuit device. Also, in various embodiments of the invention, the first and second conductive layers define an integrated capacitive laminate of the circuit board. Moreover, the localized distributive non-discrete capacitive element may be positioned at various levels or layers of a multilayer circuit board. Thus, the invention may be practiced with a wide variety of circuit board designs known within the art.

In should also be noted that the various features of the invention may be practiced without any specific claim to the type of circuit. For example, in various embodiments of the invention, the first conductive layer is the power plane of a multilayer printed circuit board while in other embodiments of the invention the first conductive layer is the ground plane of a multilayer printed circuit board.

Furthermore, it should be noted that the features of the invention may be practiced with any of the materials for circuit boards and capacitive laminates that are known within the art. In various embodiments of the invention, the first dielectric element 320 of the localized distributive non-discrete capacitive element may include a material having a high dielectric constant as chosen to achieve a desired capacitance. In various embodiments of the invention, the third conductive element 312 may include a material having high conductance or controlled resistance as chosen to achieve a desired electrical effect. These and other materials known within the art of circuit board manufacturing remain within the scope of the present invention.

One or more of the components, steps, and/or functions illustrated in FIGS. 3, 4, 5, 6, 7, 8, 9, 10 and/or 11 may be rearranged and/or combined into a single component, step, or function or embodied in several components, steps, or functions without affecting the operation of the pseudo-random number generation. Additional elements, components, steps, and/or functions may also be added without departing from the invention. The apparatus, devices, and/or components illustrated in FIGS. 3, 4, 5, 6, 7 and/or 8 may be configured to perform one or more of the methods, features, or steps described in FIG. 9.

While certain exemplary embodiments have been described and shown in the accompanying drawings, it is to be understood that such embodiments are merely illustrative of and not restrictive of the scope of the invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A printed circuit board comprising:
a first dielectric layer having a first surface and an opposite second surface;
a first conductive layer coupled to the first surface of the first dielectric layer;
a second conductive layer coupled to the second surface of the first dielectric layer; and
a localized distributive non-discrete capacitive element adjacent the first conductive layer, the localized distributive non-discrete capacitive element comprising:
a first conductive element defined by an area of the first conductive layer;

a second conductive element located in the exterior area below the device, the second conductive element defined by an isolation gap on the first conductive layer, the second conductive element separate but adjacent to the first conductive element and electrically isolated from the first conductive layer;

a dielectric element positioned over the first conductive element;

a third conductive element positioned over the dielectric element and shaped as the perimeter band, the third conductive element extending across the isolation gap,-coupled to the second conductive element and surrounding ball grid array anti-pad pattern for the device to be decoupled; and one or more electrically conductive vias coupling the second conductive element and the second conductive layer; and wherein the capacitive element is defined by a perimeter band that surrounds and approximately coincides with an outer perimeter for a device to be decoupled by the localized distributive non-discrete capacitive element, the perimeter band defining an interior open area, traversing the thickness of the printed circuit board, and an exterior area located opposite the interior open area, the interior open area devoid of any capacitive elements.

2. The printed circuit board of claim 1 further comprising:
a first electrical via extending from a first surface terminal of the device to the first conductive element; and
a second electrical via extending from a second surface terminal of the device to the second conductive layer.

3. The printed circuit board of claim 1 further comprising:
one or more circuit board layers positioned over the localized distributive non-discrete capacitive element to embed the localized distributive non-discrete capacitive element within the circuit board.

4. The printed circuit board of claim 1 wherein the first conductive layer and the second conductive layer define a buried capacitance of the printed circuit board, and the localized non-discrete capacitive element provides a distinct bypass capacitance to the device to which it is coupled.

5. The printed circuit board of claim 1 wherein a third conductive element includes a resistive material selected to achieve a desired equivalent series resistance to provide circuit resonance dampening to the device being decoupled.

6. The printed circuit board of claim 1 wherein the interior open area defined by the perimeter band is approximately the size of the device.

7. The circuit board of claim 1, wherein the third conductive element includes a resistive material selected to achieve a desired equivalent series resistance to provide circuit resonance dampening to the device being decoupled.

8. The circuit board of claim 1, further comprising:
a plurality of vias located within the interior open area, the plurality of vias coupling to the device through one or more layers of the printed circuit board.

9. The circuit board of claim 1, wherein the device mounts to the circuit board by a ball grid array within the interior open area.

10. A localized distributive non-discrete capacitive element embedded in a circuit board comprising:
a first conductive element defined by an area of a first conductive layer of the circuit board;
a second conductive element located in an exterior area below a device to be decoupled by the capacitive element, the second conductive element defined by an isolation gap on the first conductive layer, the second conductive element separate but adjacent to the first conductive element and electrically isolated from the first conductive layer;
a dielectric element positioned over the first conductive element and extending to a region between the first conductive element and the second conductive element; and
a third conductive element positioned over the dielectric element and shaped as a perimeter band that surrounds and approximately coincides with an outer perimeter for the device to be decoupled by the localized distributive non-discrete capacitive element, the third conductive element extending across the isolation gap, and coupled to second conductive element to form a bypass capacitor between the first conductive element and the third conductive element, the perimeter band defining an interior open area, traversing the thickness of the circuit board, and the exterior area located opposite the interior open area, the interior area devoid of any capacitive elements.

11. The localized distributive non-discrete capacitive element of claim 10 wherein one or more circuit board layers are positioned over the localized distributive non-discrete capacitive element to embed the capacitive element within the circuit board.

12. The localized distributive non-discrete capacitive element of claim 10 wherein the capacitive element occupies a region below a keep out zone on the surface of the circuit board proximate the device to be coupled to the capacitive element, where the keep out zone is an area devoid of surface mounted devices.

13. The localized distributive non-discrete capacitive element of claim 10, wherein the dielectric element is shaped as a second perimeter band larger than the third conductive element perimeter band.

14. The localized distributive non-discrete capacitive element of claim 10, wherein the second conductive element is located outside the perimeter band and coupled to one of either a power plane or a ground plane.

15. The localized distributive non-discrete capacitive element of claim 10, further comprising:
a plurality of additional conductive elements located in a region outside an area below a device to be decoupled by the capacitive element, each of the additional conductive elements defined by an isolation gap on the first conductive layer, the additional conductive elements separate but adjacent to the first conductive element and electrically isolated from the first conductive layer, wherein the second conductive element and each of the plurality of additional conductive elements are located on different sides of the perimeter band.

16. A circuit board comprising:
a plurality of conductive and dielectric layers forming a multilayer circuit board;
a device mounted on a surface of the multilayer circuit board;
a localized distributive non-discrete capacitive element embedded within the multilayer circuit board, the localized distributive non-discrete capacitive element comprising:
a first conductive element defined by an area of the first conductive layer;
a second conductive element located in the exterior area below the device, the second conductive element defined by an isolation gap on the first conductive layer, the second conductive element separate but adjacent to the first conductive element and electrically isolated from the first conductive layer;

a dielectric element positioned over the first conductive element;

a third conductive element positioned over the dielectric element and shaped as the perimeter band, the third conductive element extending across the isolation gap,-coupled to the second conductive element and surrounding a ball grid array anti-pad pattern for the device to be decoupled; and one or more electrically conductive vias coupling the second conductive element and the second conductive layer; and wherein the capacitive element is defined by a perimeter band that surrounds and approximately coincides with an outer perimeter for the device which is decoupled by the localized distributive non-discrete capacitive element, the perimeter band defining an interior open area, traversing the thickness of the multilayer circuit board, and the exterior area located opposite the interior open area, the interior area devoid of any capacitive elements used by the device.

17. The circuit board of claim 16, wherein the localized distributive non-discrete capacitive element is uniquely associated with the device.

18. The circuit board of claim 16, further comprising:

a plurality of vias located within the interior open area, the plurality of vias coupling the device to one or more layers of the multilayer circuit board.

* * * * *